United States Patent
Mensah-Brown et al.

(10) Patent No.: US 10,374,266 B2
(45) Date of Patent: Aug. 6, 2019

(54) WIRELESS TRACTION BATTERY FORCE SENSOR

(71) Applicant: Ford Global Technologies, LLC, Dearborn, MI (US)

(72) Inventors: Arnold Kweku Mensah-Brown, Canton, MI (US); Richard Dyche Anderson, Plymouth, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 499 days.

(21) Appl. No.: 15/151,781

(22) Filed: May 11, 2016

(65) Prior Publication Data

US 2017/0331160 A1 Nov. 16, 2017

(51) Int. Cl.
*H01M 10/44* (2006.01)
*G01R 31/382* (2019.01)
(Continued)

(52) U.S. Cl.
CPC ........... *H01M 10/445* (2013.01); *B60L 53/00* (2019.02); *B60L 53/14* (2019.02); *B60L 58/12* (2019.02); *B60L 58/20* (2019.02); *G01L 11/04* (2013.01); *G01R 31/382* (2019.01); *H01M 2/1077* (2013.01); *H01M 10/04* (2013.01); *H01M 10/4257* (2013.01); *H01M 10/46* (2013.01); *H01M 10/482* (2013.01); *H02J 7/0029* (2013.01); *H02J 7/0052* (2013.01); *B60L 50/15* (2019.02); *B60L 2240/54* (2013.01); *B60L 2240/545* (2013.01); *H01M 2010/4271* (2013.01); *H01M 2010/4278* (2013.01); *H01M 2220/20* (2013.01); *H02J 2007/0037* (2013.01); *Y02T 10/7005* (2013.01); *Y02T 10/7044* (2013.01); *Y02T 10/7066* (2013.01);
(Continued)

(58) Field of Classification Search
CPC ............ H01M 10/445; H01M 10/4257; H02J 7/0029; B60L 11/1809; G01R 31/44
USPC ......................................... 320/109, 134, 150
See application file for complete search history.

(56) References Cited

U.S. PATENT DOCUMENTS

| 10,014,561 B2 * | 7/2018 | Sood ................. G01R 31/3679 |
| 2015/0188198 A1 | 7/2015 | Bonhomme et al. |

(Continued)

OTHER PUBLICATIONS

Shankar Mohan et al., A Phenomenological Model of Bulk Force in a Li-Ion Battery Pack and Its Application to State of Charge Estimation, Journal of the Electrochemical Society, 161, Oct. 30, 2014, pp. A222-A2231.

(Continued)

*Primary Examiner* — Edward Tso
*Assistant Examiner* — Aaron Piggush
(74) *Attorney, Agent, or Firm* — David B. Kelley; Brooks Kushman P.C.

(57) ABSTRACT

A traction battery of a vehicle includes a temperature compensated passive wireless surface acoustic wave sensor within the traction battery and a controller. The temperature compensated passive wireless surface acoustic wave sensor is configured to receive a broadcast signal and transmit a reflected signal. The controller is programmed to transmit the broadcast signal and receive the reflected signal, and based on a difference in phase and amplitude between the broadcast and reflected signals indicative of an increase in pressure within the traction battery, stop charging the traction battery.

20 Claims, 5 Drawing Sheets

(51) Int. Cl.

| | | |
|---|---|---|
| *G01L 11/04* | (2006.01) | |
| *H01M 10/04* | (2006.01) | |
| *H01M 10/42* | (2006.01) | |
| *H01M 10/46* | (2006.01) | |
| *H01M 10/48* | (2006.01) | |
| *H02J 7/00* | (2006.01) | |
| *H01M 2/10* | (2006.01) | |
| *B60L 53/14* | (2019.01) | |
| *B60L 53/00* | (2019.01) | |
| *B60L 58/12* | (2019.01) | |
| *B60L 58/20* | (2019.01) | |
| *B60L 50/15* | (2019.01) | |

(52) U.S. Cl.
CPC ........ *Y02T 10/7072* (2013.01); *Y02T 10/7077* (2013.01); *Y02T 90/14* (2013.01); *Y10S 903/907* (2013.01)

(56) References Cited

U.S. PATENT DOCUMENTS

| | | |
|---|---|---|
| 2015/0210182 A1 | 7/2015 | Phlegm et al. |
| 2015/0318724 A1 | 11/2015 | Brockman et al. |
| 2016/0084911 A1* | 3/2016 | Mensah-Brown ............................ G01R 31/3606 318/139 |

OTHER PUBLICATIONS

B. Dixon et al., A Second Generation In-Car Tire Pressure Monitoring System Based on Wireless Passive SAW Sensors, Transense Technologies PLC, Bicester, Oxfordshire, UK, 2006, pp. 375-380.

T.L. Chin et al., Surface Acoustic Wave Devices for Wireless Strain Measurement, Carnegie Mellon University, Pittsburgh, PA, Mar. 2010, 8 pgs.

The Global SAW Tag—a New Technical Approach to RFID, RFSAW, Inc., Richardson, Texas, 2004, pp. 1-4.

W.C. Wilson et al., Rapid SAW Sensor Development Tools, NASA Langley Research Center, Hampton, Virginia, Aug. 2014, pp. 1-7.

J.R. Humphries et al., Passive, Wireless SAW OFC Strain Sensor, IEEE, 2012, 6 pgs.

* cited by examiner

WIRELESS TRACTION BATTERY FORCE SENSOR

TECHNICAL FIELD

This application is generally related to operating a traction battery of a vehicle based on a pressure from a surface acoustic wave (SAW) structure.

BACKGROUND

Electrified vehicles include hybrid electric vehicles (HEV) and battery electric vehicles (BEV). Electrified vehicles include a traction battery to store energy to be used for propulsion and other purposes. The traction battery is generally operated according to various parameters. During operation the parameters of the traction battery change causing changes in performance of the traction battery. One of the operating parameters is a state of charge (SOC) of the battery; as the SOC changes the control of the battery and vehicle changes to compensate for the changes.

SUMMARY

A traction battery of a vehicle includes a temperature compensated passive wireless surface acoustic wave sensor within the traction battery and a controller. The temperature compensated passive wireless surface acoustic wave sensor is configured to receive a broadcast signal and transmit a reflected signal. The controller is programmed to transmit the broadcast signal and receive the reflected signal, and based on a difference in phase and amplitude between the broadcast and reflected signals indicative of an increase in pressure within the traction battery, stop charging the traction battery.

A method of operating a battery in a vehicle by a controller includes transmitting a broadcast signal to a surface acoustic wave (SAW) sensor, receiving a reflected signal from the SAW sensor, and operating the battery according to a difference between the broadcast and reflected signals indicative of a pressure within the battery.

A vehicle traction battery includes a temperature compensated passive wireless surface acoustic wave sensor within the traction battery and a controller. The temperature compensated passive wireless surface acoustic wave sensor is configured to receive a broadcast signal and transmit a reflected signal. The controller is programmed to transmit the broadcast signal and receive the reflected signal, and in response to a difference in phase and amplitude between the broadcast and reflected signals indicative of a pressure within the traction battery exceeding a threshold, charge the traction battery.

DETAILED DESCRIPTION

Figure 1:
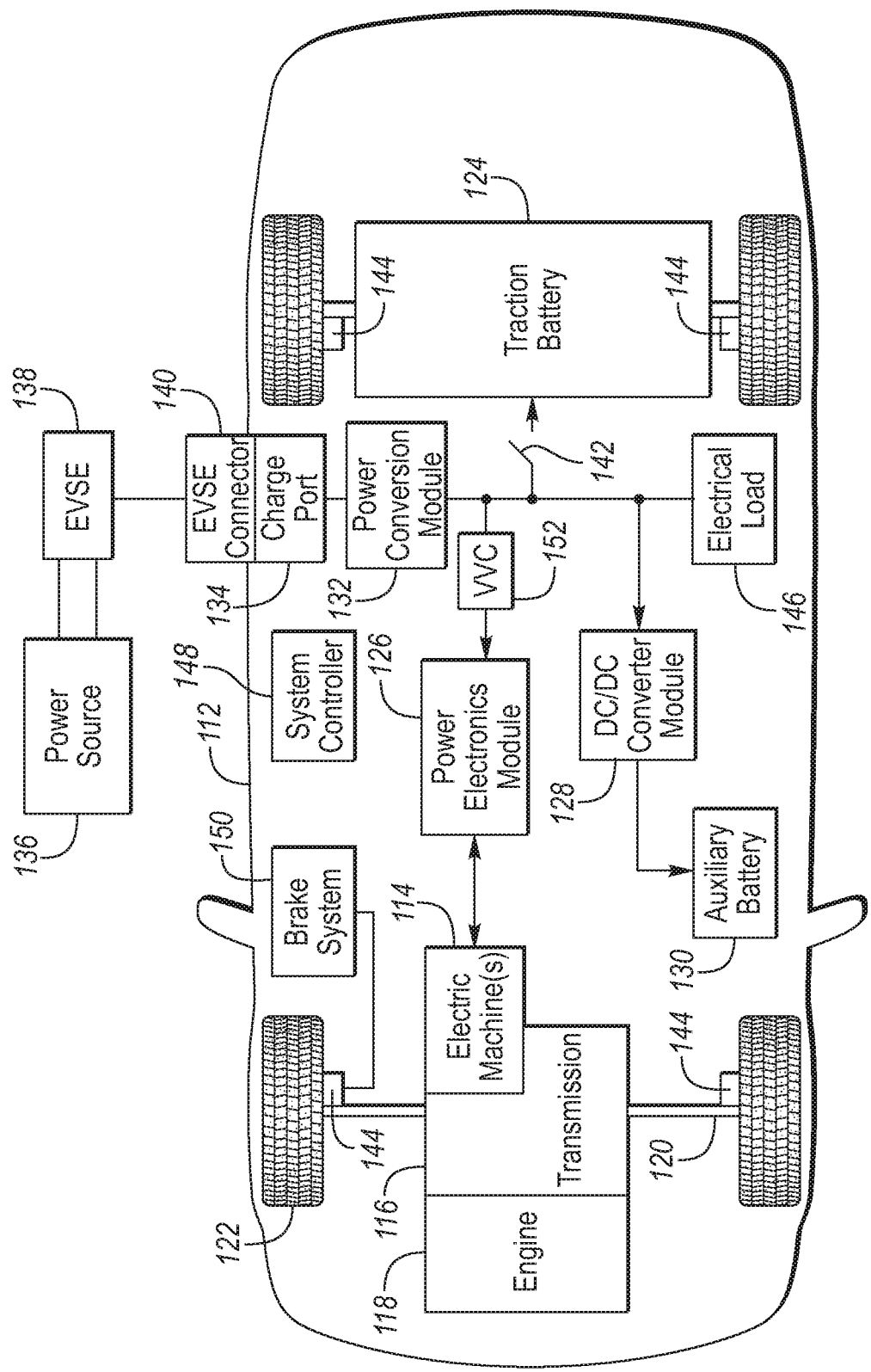
FIG. 1 is a diagram of a hybrid vehicle illustrating typical drivetrain and energy storage components.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

A common way to estimate a state of charge (SOC) of a battery is by measuring the open circuit voltage (OCV) of the battery and then calculating the estimated SOC based on the OCV. Using the OCV method has some limitations, for example, ideally the OCV is measured while the battery is at rest. However, during operation the battery is often under load thus reducing the accuracy of this method of measurement. Another limitation is that the change in OCV is small over a typical operating range of a battery.

Here the use of a wireless surface acoustic wave (SAW) sensor to measure a force within a traction battery is disclosed that provides improved accuracy of an estimated state of charge (SOC). The force or pressure is based on the carbon expansion/contraction associated with the phase change of the electrodes of the battery cells during charging/discharging. The expansion/contraction is a result of the movement of lithium ions into and out of the electrode. Based on data collected, a nonlinear relationship between force, SOC and temperature has been observed. This relationship may be used to compute a more robust SOC estimation, especially in the range of 30% to 50% SOC for hybrid vehicles. The use of a wire based SAW structure has been considered along with a cost associated with load cells and a number of wires required per sensor (an active SAW sensor requires 4 wires per sensor.) For a wire based sensor, other considerations such as packaging, and routing the wires has to be considered.

The development and adaption of a wireless SAW sensor for a traction battery of vehicle provides in-situ real-time monitoring of forces within the traction battery. Here, a SAW sensor, such as a small chip-like SAW device, may be located within a cell array structure for traction battery of an electrified vehicle. The measured expansion force may be used to determine the state of charge (SOC) and/or state of health (SOH) of the battery pack. The SAW sensor would be configured to measure pressure within the battery and output a signal indicative of the force of the pressure. SAW devices also may be configured with the capability of measuring temperature, and in some configurations, a SAW device may be configured to output the signal indicative of the force of the pressure compensated in regards to the temperature. Thus a single sensor device can be designed to measure both temperature and force.

Surface acoustic wave (SAW) sensors are small, robust, solid-state components in which a wave propagates along the surface of a piezoelectric material. Changes in force or temperature shifts the acoustic wave velocity of the propagating wave. The shift may be monitored in relation to the measurands (force/pressure and temperature) by a single device.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present. In other configurations, the electrified vehicle 112 may be a full hybrid-electric vehicle (FHEV) without plug-in capability.

A traction battery or battery pack 124 stores energy that can be used by the electric machines 114. The vehicle battery pack 124 may provide a high voltage direct current (DC) output. The traction battery 124 may be electrically coupled to one or more power electronics modules 126. One or more contactors 142 may isolate the traction battery 124 from other components when opened and connect the traction battery 124 to other components when closed. The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) 152 electrically coupled between the traction battery 124 and the power electronics module 126. The VVC 152 may be a DC/DC boost converter configured to increase or boost the voltage provided by the traction battery 124. By increasing the voltage, current requirements may be decreased leading to a reduction in wiring size for the power electronics module 126 and the electric machines 114. Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high voltage DC output of the traction battery 124 to a low voltage DC supply that is compatible with low-voltage vehicle loads. An output of the DC/DC converter module 128 may be electrically coupled to an auxiliary battery 130 (e.g., 12V battery) for charging the auxiliary battery 130. The low-voltage systems may be electrically coupled to the auxiliary battery 130. One or more electrical loads 146 may be coupled to the high-voltage bus. The electrical loads 146 may have an associated controller that operates and controls the electrical loads 146 when appropriate. Examples of electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components.

Figure 2:
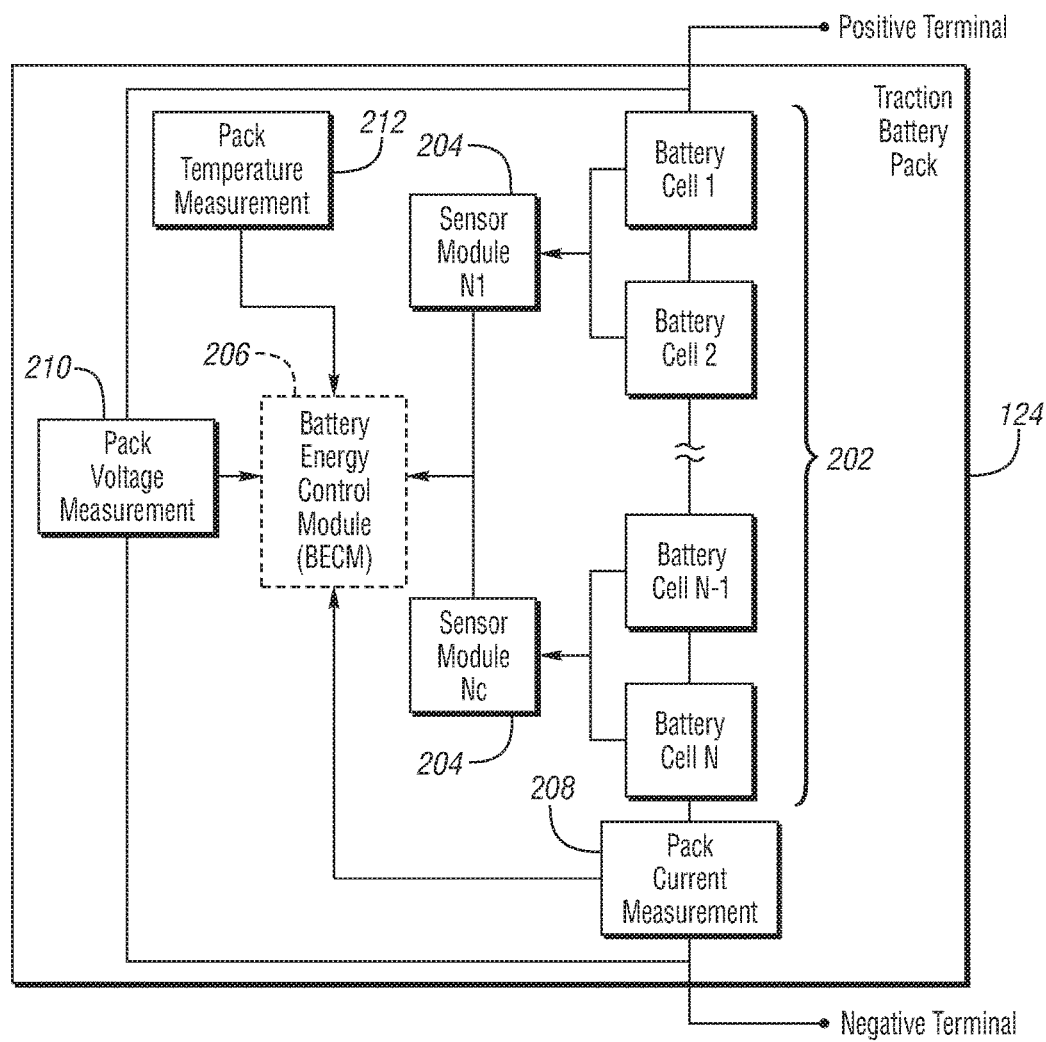
FIG. 2 is a block diagram of a battery pack comprised of multiple cells, and monitored and controlled by a Battery Energy Control Module.

The traction battery 124 may be constructed from a variety of chemical formulations. Typical battery pack chemistries may be lead acid, nickel-metal hydride (NIMH) or Lithium-Ion. FIG. 2 shows the traction battery pack 124 as a simple series configuration of N battery cells 202. The traction battery 124, however, may be composed of any number of individual battery cells connected in series or parallel or some combination thereof. A battery management system may have one or more controllers, such as a Battery Energy Control Module (BECM) 206, that monitor and control the performance of the traction battery 124. The traction battery 124 may include sensors to measure various pack level characteristics. The traction battery 124 may include one or more pack current measurement sensors 208, pack voltage measurement sensors 210, and pack temperature measurement sensors 212. The BECM 206 may include circuitry to interface with the pack current sensors 208, the pack voltage sensors 210 and the pack temperature sensors 212. The BECM 206 may have non-volatile memory such that data may be retained when the BECM 206 is in an off condition. Retained data may be available upon the next key cycle. The pack measurement sensor 212 includes a SAW sensor located within the pack.

In addition to the pack level characteristics, there may be battery cell 202 level characteristics that are measured and monitored. For example, the terminal voltage, current, and temperature of each cell 202 may be measured. A system may use one or more sensor modules 204 to measure the battery cell 202 characteristics. Depending on the capabilities, the sensor modules 204 may measure the characteristics of one or multiple of the battery cells 202. The traction battery 224 may utilize up to $N_c$ sensor modules 204 to measure the characteristics of all the battery cells 202. Each of the sensor modules 204 may transfer the measurements to the BECM 206 for further processing and coordination. The sensor modules 204 may transfer signals in analog or digital form to the BECM 206. In some configurations, the functionality of the sensor modules 204 may be incorporated internally to the BECM 206. That is, the hardware of the sensor modules 204 may be integrated as part of the circuitry in the BECM 206 and the BECM 206 may handle the processing of raw signals. The BECM 206 may also include circuitry to interface with the one or more contactors 142 to open and close the contactors 142.

It may be useful to calculate various characteristics of the battery pack. Quantities such as battery power capability, battery capacity, and battery state of charge may be useful for controlling the operation of the traction battery 124 as well as any electrical loads receiving power from the traction battery 124. Battery power capability is a measure of the maximum amount of power the traction battery 124 can provide or the maximum amount of power that the traction battery 124 can receive. Knowing the battery power capability allows the electrical loads to be managed such that the power requested is within limits that the traction battery 124 can handle.

Battery capacity is a measure of a total amount of energy that may be stored in the traction battery 124. The battery capacity (often represented by variable Q) may be expressed in units of Amp-hours. Values related to the battery capacity may be referred to as amp-hour values. The battery capacity of the traction battery 124 may decrease over the life of the traction battery 124.

State of charge (SOC) gives an indication of how much charge remains in the traction battery 124. The SOC may be expressed as a percentage of the total possible charge remaining in the traction battery 124. When the SOC is at one hundred percent, the traction battery 124 may be charged to the battery capacity. The SOC value may be output to inform the driver of how much charge remains in the traction battery 124, similar to a fuel gauge. The SOC may also be used to control the operation of an electric or hybrid-electric vehicle. Calculation of SOC can be accomplished by a variety of methods. One possible method of calculating SOC is to perform an integration of the traction battery current over time. This is well-known in the art as ampere-hour integration.

An energy management system or vehicle power system may operate the traction battery 124 to manage the state of charge of the traction battery 124. The traction battery 124 may be charged or discharged according to a target state of charge compared to a present state of charge. For example, when the present state of charge is greater than the target state of charge, the traction battery 124 may be discharged. Operation of the traction battery 124 may be achieved by commanding a torque of the electric machines 114 to draw current from or provide current to the traction battery 124. Operation of the traction battery 124 may further involve commanding operation of the engine 118 to provide power to the electric machines 114 to charge the traction battery 124.

Figure 3A:
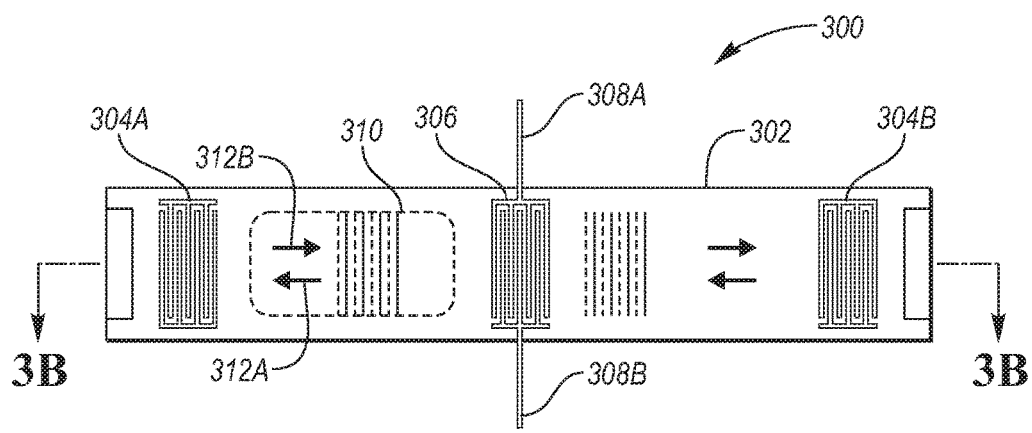
FIG. 3A is a top view of a Surface Acoustic Wave (SAW) device configured to measure a pressure of a battery.

FIG. 3A is a top view of a Surface Acoustic Wave (SAW) sensor 300 configured to measure a temperature compensated pressure and temperature of a battery. A SAW sensor also referred to as a SAW device or SAW structure may be configured as an active SAW sensor or a passive SAW sensor. An active SAW sensor includes electrical connections such that it is electrically coupled with and powered by an external AC voltage source. The active SAW sensor includes electrical conductors to carry the supply voltage. A passive SAW sensor 300 operates without any external power source. A controller, module, or transmitter emits a signal (e.g., a radio wave pulse) that is received by an antenna 308 of the passive SAW sensor 300 and the signal is converted into a mechanical wave 312 that travels down a crystal 302 by an interdigitated transducer (IDT) 306. The mechanical wave 312 travels down the longitudinal axis of the SAW sensor 300. The acoustic wave travels past a set of wave reflectors 304 to produce uniquely encoded acoustic wave pulses, which travel back to the IDT 306. The IDT 306 converts the pulses into an encoded radio wave reflected signal 312A that is sent back to the controller via the antenna 308. The SAW sensor operates based on a piezoelectric effect of the crystal substrate 302 and may be configured to operate without any direct applied AC voltage. The piezoelectric effect naturally occurs in some materials such as quartz, lithium niobate (LiNbO$_3$), and lithium tantalate (LiTaO$_3$). A velocity of a typical SAW is $10^5$ times slower than an electromagnetic (EM) wave. Thus, may have a wavelength that is $10^5$ times smaller than an EM wave. Due to the slow propagation and small wavelength, it is possible to perform very complex signal processing functions/measurements in a very small space.

Figure 3B:
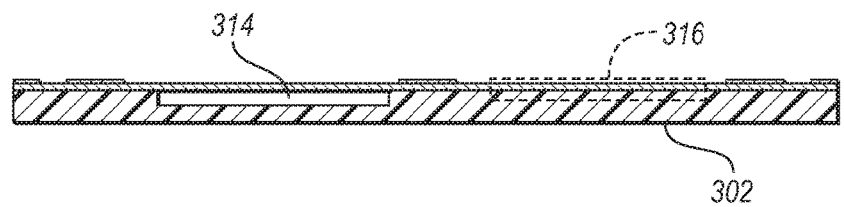
FIG. 3B is a side view of the SAW device configured to measure a pressure of a battery.

FIG. 3B is a side view of a Surface Acoustic Wave (SAW) sensor configured to measure a pressure of a battery. This side view illustrates the vertical structure by slicing the lateral axis. The passive SAW sensor 300 includes a first reflector 304A configured to alter a reflected pulse based on temperature and pressure changes as the pulse propagates through an area 310 that includes a void 314 under the surface material. The second reflector is configured to propagate a pulse through an area 316 based on temperature changes, thus a combination of the reflected pulses from the first and second reflectors from the IDT produces temperature compensated reflected pulses. Signal processing techniques may then be applied to the sensor response signals to remove the contribution from temperature to get a pressure/force response. This configuration permits the simultaneous monitoring of both temperature and pressure/force by a single sensor. The IDT is configured with an antenna 308 that includes a positive 308A and negative 308B side. The antenna are configured to received RF energy and pass that RF energy to the IDT structure 306, and transmit RF energy received from the IDT based on the reflected pulses.

The IDT and reflector structures are usually constructed from thin metal films, aluminum or gold, by single layer lithography. The use of a Y-cut, z-propagating LiNbO$_3$ substrate (YZ—LiNbO$_3$) for automotive SAW sensors provided desirable results. This cut of crystal was selected based on its high electromechanical coupling factor and self-collimating (i.e., minimizes wave diffraction) properties, which help to decrease losses in the sensor. Also, YZ—LiNbO$_3$ has a high temperature coefficient of delay (TCD=−94 ppm/° C.), a desirable characteristic for temperature sensing application but not for strain measurement.

Since the SAW sensors are sensitive to temperature, pressure, stress, liquid viscosity, and surface effects, use of a wide range of sensors in a battery are possible. In another embodiment, an array of SAW sensors may be located in a single battery such that each sensor of the array responds to a different measurand. Provided a SAW sensor is constructed to withstand the caustic environment, the sensor may be embedded within the casing of the cell in intimate contact with the electrode and electrolyte. Further, the array of SAW sensors may be powered by a broadcast signal transmitted by a controller in which each SAW sensor of the array may send a reply signal to the controller based on the reflected pulse.

Use of a SAW sensor based on the concept of orthogonal frequency coding (OFC) provided desirable results in a battery system. OFC is a spread spectrum technique for encoding the SAW sensor reflected pulse. The OFC technique has an inherent advantage of processing both gain and security simultaneously. The OFC technique allows both frequency and pseudo noise (PN) coding, and use of a chirp interrogation signal for increased power. The OFC technique is a hybridization of orthogonal frequency division multiplexing (OFDM) and binary phase shift keying (BPSK) coding techniques.

Figure 4:
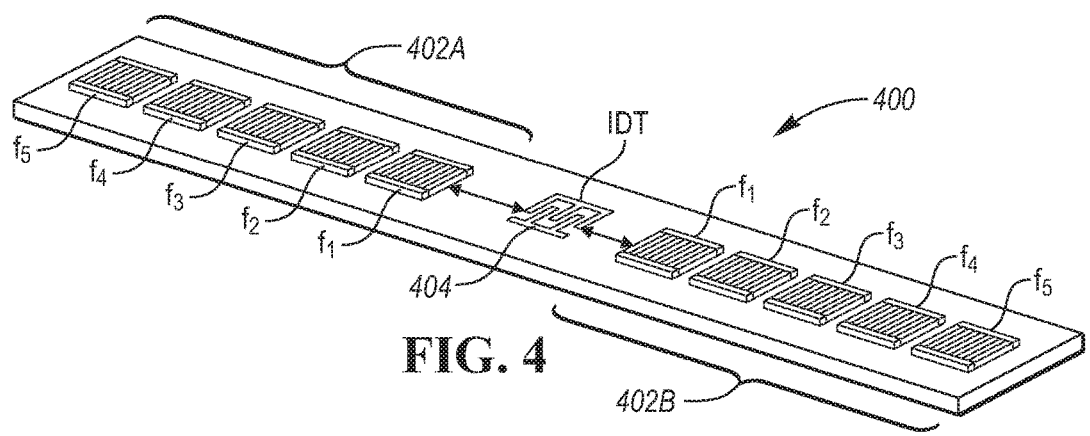
FIG. 4 is a perspective view of a single port dual delay orthogonal frequency coding (OFC) SAW including 5 reflectors per OFC bank.

FIG. 4 is a perspective view of a single port dual delay OFC SAW sensor 400. The OFC sensor is implemented as two arrays of SAW reflector banks, a first array bank 402A and a second array bank 402B. The configuration may include a void as illustrated in FIG. 3a element 310 and FIG. 3b element 314. Each bank 402 is composed of a sequence of reflectors with center frequencies from $f_1$ to $f_5$. The time lengths and frequencies of each reflector are selected such that the peak of each reflector lines up with the nulls of all other reflectors. The relationship of orthogonality is shown in equation (1) below:

$$N_j = \tau_c f_j \quad (1)$$

In which $N_j$ is the number of reflector electrodes, is the reflector length (i.e., time length of each reflector), and $f_j$ is the reflector frequency. Once a set of frequencies has been selected, frequencies within the set may be shuffled in time to produce a unique code. The unique code depends on a number of reflectors ($N_c$) and use of PN coding in which $2^{N_c} N_c!$ codes are possible.

Figure 5A:
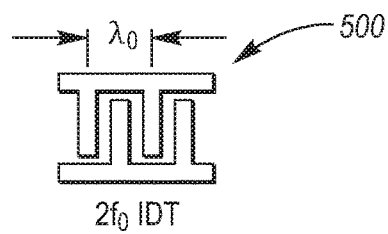
FIG. 5A is a top view of a layout of a $2f_0$ interdigitated transducer (IDT).
Figure 5B:
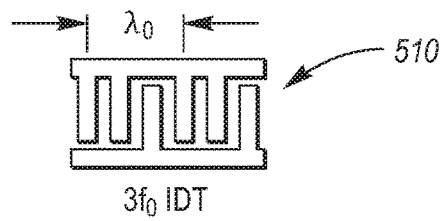
FIG. 5B is a top view of a layout of a $3f_0$ IDT.
Figure 5C:
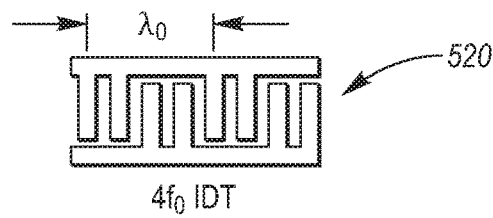
FIG. 5C is a top view of a layout of a $4f_0$ IDT.

IDT 404 consists of electrodes of opposite polarity that are interwoven and are separated by a dielectric. This arrangement is capacitive in nature but due to the finite resistance of the electrodes, the IDT also possesses a series resistance. FIGS. 5A, 5B and 5C are an illustration of IDT structures with different electrode structures. FIG. 5A is a $2f_0$ electrode layout 500 in which two electrodes and two spaces occur per wavelength and the configuration is tuned for a sampling frequency $f_s=2f_0$. FIG. 5B is a $3f_0$ electrode layout 510 in which three electrodes and three spaces occur per wavelength and the configuration is tuned for a sampling frequency $f_s=3f_0$. FIG. 5C is a $4f_0$ electrode layout 520 in which four electrodes and four spaces occur per wavelength and the configuration is tuned for a sampling frequency $f_s=4f_0$. $3f_0$ and $4f_0$ are also referred to as split electrodes in which transducers are used to minimize internal reflections.

Figure 6:
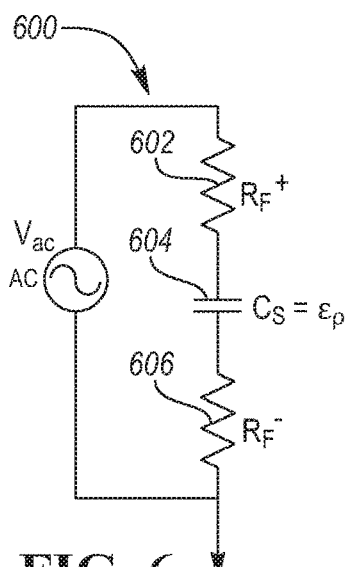
FIG. 6 is a schematic diagram of an electrical representation of an IDT electrode pair.

An equivalent circuit 600 provides an electrical representation of the electrode pair is shown in FIG. 6. Here, a series resistance of the positive electrode ($R_F^+$) 602, a dielectric constant of the substrate ($C_s$) 604, and series resistance of the negative electrode ($R_F^-$) 606 are shown. The total electrode resistance of the IDT is given by the equations 2 and 3 shown below:

$$\frac{1}{R_F} = \frac{1}{R_{F_{eq}}^+} + \frac{1}{R_{F_{eq}}^-} = \sum_{\#+electrodes} \frac{1}{R_F^+} + \sum_{\#-electrodes} \frac{1}{R_F^-} \quad (2)$$

$$R_{F_{eq}}^+ = R_{F_{eq}}^- = R_s \frac{W_a}{W_e} \quad (3)$$

In which $R_s$ is the sheet resistance (in Ohm/square) of the electrode, $W_a$ is the electrode overlap in meters, $W_e$ is the electrode width in meters, "#+electrodes" is the number of positive electrodes, and "#−electrodes" is the number of negative electrodes.

A static capacitance of the entire IDT is given by equation 4 shown below:

$$C_t = N_p W_a \varepsilon_p \quad (4)$$

In which $N_p$ is the number of electrode finger pairs which is given by equation 5 shown below:

$$N_p = \text{round}\left(\frac{2}{NBW}f_0\right) \quad (5)$$

in which NBW is the null bandwidth or fractional frequency of the IDT. The input admittance of the IDT is a frequency dependent complex term. The real part is called the radiation conductance, $G_a(f)$, and the imaginary part is called the acoustic susceptance, $B_a(f)$. These parameters follow an electro-acoustic transduction process and are represented by equations (6) and (7) shown below:

$$G_a(f) = \alpha f_0 \varepsilon_p W_a N_p^2 K^2 \left(\text{sinc}\left(\pi\frac{(f-f_0)}{f_0}N_p\right)\right)^2 \quad (6)$$

$$B_a(f) = G_a(f_0) \frac{\sin\left(2\pi\frac{(f-f_0)}{f_0}N_p\right) - 2\left(\pi\frac{(f-f_0)}{f_0}N_p\right)}{2\left(\pi\frac{(f-f_0)}{f_0}N_p\right)^2} \quad (7)$$

In which $K^2$=electromechanical coupling coefficient, $\alpha$ is ~9, 5.9, and 9.77 for $2f_0$, $3f_0$, and $4f_0$ IDTs, respectively.

During operation of a SAW sensor, a SAW wave is reflected whenever an impedance discontinuity is in the propagation path of the wave. Here, reflectors include shorted electrode design reflectors that are configured with a periodicity (p) of $\lambda/2$ and width (a) of $\lambda/4$. The impedance beneath the electrode, $Z_0+\Delta Z$, is different from the free surface impedance, $Z_0$. The difference results in a portion of the SAW wave to be reflected at the electrode-free space boundary. At each interface, a small reflection coefficient, $r_{REF}$, is represented by equation 9 shown below:

$$r_{REF} = j\frac{\Delta Z}{Z_0}\sin\left(\frac{a}{p}\pi\frac{f}{f_0}\right) = j\left(e_4\frac{K^2}{2} + e_5\frac{hf}{v_{REF}}\right)\sin\left(\frac{a}{p}\pi\frac{f}{f_0}\right) \quad (9)$$

In which $e_4$ and $e_5$ represent the piezoelectric shorting and mass loading contributions to the reflectivity. A magnitude of the net reflection of a reflector is represented by equation 10 shown below:

$$|R| = \tan h(N|r_{REF}|) \quad (10)$$

In which N is a total number of electrodes in the reflector. For $N|r_{REF}| \ll \pi$, the null bandwidth of the reflector is represented by equation 11 shown below:

$$NWB_{REF} = \frac{2f_0}{N} \quad (11)$$

and a transfer function of the reflector may be approximated by a sinc function as described in equation 12 shown below:

$$H_{REF}(f) \approx |R|\text{sinc}\left(\frac{2\pi(f-f_0)}{NBW_{REF}}\right) \approx |R|\text{sinc}\left(\frac{N\pi(f-f_0)}{f_0}\right). \quad (12)$$

And, a SAW velocity beneath the reflector may be approximated by equation 13 shown below:

$$v_{REF} = v_f\left(1 - e_1\frac{K^2}{2} - e_2\frac{hf_0}{v_f} - e_3\left(\frac{hf_0}{v_f}\right)^2\right), \quad (13)$$

In which $e_1$ is the electrical loading term, $e_2$ and $e_3$ is the mechanical loading terms.

As illustrated in FIG. 4, the reflectors are located on each side of the IDT in the sensor. To meet the constraint of orthogonality, a peak of each frequency occurs at the null for all of the other peaks. This allows the mechanical wave energy to pass through reflectors that do not match the reflector frequency criteria and be reflected only by a corresponding reflector. The response of each reflector is given by $H_{REF}$ from equation 12 above.

In one example, a SAW sensor was configured as shown in FIG. 4 such that each reflector was uniform, N=44, and h=1000 angstroms with an electrode width, $a=\lambda/4$ and a periodicity $p=\lambda/2$. Center frequencies of the reflectors were $f_1$=861 MHz, $f_2$=881.5 MHz, $f_3$=902 MHz, $f_4$=922.5 MHz, and $f_5$=943 MHz. This configuration provided a bandwidth of 100 MHz that is equal to the bandwidth of the IDT and is a subsection that was used for cross correlation to measure frequency shift.

The frequency response of the single port delay SAW sensor may be approximated by a simplified first order model. Often in practice SAW sensors are modeled using the coupling of modes (COM) model, which was originally developed for optics modeling. The first order model gives comparable results to the COM model. When the IDT is excited with an electrical signal, an initial reflection due to the difference in impedance between the voltage source and the IDT often occurs. The energy that is absorbed by the IDT is converted to an electromechanical wave and is transmitted in two directions simultaneously. The wave travels down the crystal then bounces off the reflector back toward the transducer where it is once a partially reflected or regenerated by the IDT. The wave continually travels between the reflector and transducer until there is no energy remaining and the reflections die off creating multiple transits and a standing wave pattern. Each reflector is located at a different distance relative to the IDT. And, since the transmission is bidirectional, there is no need for sign convention of left or right. For example, if the IDT is a 3-port device, it consists of 1 electrical port and 2 acoustic ports and the reflector only consists of 2 acoustic ports. The acoustic admittance of the IDT is periodically modulated by the reflected waves from the reflector bank—with amplitude $H_{REF}(\omega)$ at times $\tau_D$=2 kL/$\omega$, 4 kL/$\omega$, 6 kL/$\omega$, etc—as the SAW propagates back and forth between the IDT and reflector. The input admittance of the IDT is modulated by multiple reflections and is represented by equation 14:

$$Y_{in\_total}(\omega) = Y_{in}(\omega) + H_{REF}(\omega)G_a(\omega)\exp(-j2kL) \quad (14)$$

In which k is the free space propagation constant represented by equation 15:

$$k = \frac{\omega}{v_f} = \frac{2\pi f}{v_f}. \quad (15)$$

The input amplitude reflection coefficient of the transducer is simply represented by equation 16:

$$S_{11}(\omega) = \frac{Y_0 - Y_{in\_total}(\omega)}{Y_0 - Y_{in\_total}(\omega)} \quad (16)$$

In which $G_a(\omega)$, $Y_{in}(\omega)$ and $H_{REF}(\omega)$ is given by equations, 6, 8, and 12 respectively. A comparison was performed of $S_{11}$ of the IDT (eq. 8) and modulated-admittance (eq. 16) for a 902 MHz, single-port, dual SAW delay line on YZ—LiNbO$_3$ that provided correlation between the IDT model and the modulated admittance model. The IDT was a uniform, 3f$_0$, with N$_p$=18, beam width, W$_a$=50λ, electrode width, W$_e$=λ/6, R$_s$=0.2 Ohm/square, and metal thickness, h=1000 Å, and the reflector was uniform, N=44 and h=1000 Å. Note that the second term in equation 14 was different for each reflector. A plot of $S_{11}$ in the time domain may be produced using a Fast Fourier Transform (FFT). This plot may illustrates a location of the reflectors in the time domain such that for each reflector the wave travels a distance of 2 L.

Another example of an OFC SAW sensor includes a YZ—LiNbO$_3$ substrate. The OFC SAW parameters include, a center frequency (f$_0$) of 902 MHz, a bandwidth of 100 MHz, a V$_{free\ surface}$ of ~3488 m/s, a λ of 3.867 μm, and an aluminum metal thickness h of 100 nm=1000 Å. In this example, the IDT included a 3f$_0$ structure, metallization ratio of 50%, NWB of 100 MHz, electrode array per wavelength (S$_e$) of 3, Beam width or electrode overlap (W$_a$) of 50λ, electrode width (W$_e$) of λ/2S$_e$, a number of positive electrodes/period is 2, a number of negative electrodes/period is 1, a number of electrode finger pairs (N$_p$) of 18, and a length of the IDT of 18λ. The reflector structure includes a number of reflectors of 5, NWB$_{bit}$ of 100 MHz, Null bandwidth of each reflector (NWB$_{chip}$) of 2*NWB$_{bit}$/N$_c$, a total number of electrodes in each reflector (N$_{chip}$) of 44, a center frequency of 902 MHz, a metallization ratio of 50%, an electrode width (a) of λ/4, a period of λ/2, a reflector null bandwidth (NBW_REF) of 2f$_0$/N. Frequencies of each individual reflector include f3=f0, f1=f3−2*(NBW_REF/2), f2=f3−(NBW_REF/2), f4=f3+(NBW_REF/2), f5=f3+2*(NBW_REF/2), and a reflector length (L_REF) of N*p=Nλ/2, and a distance between reflectors (d$_1$) of 30 μm.

Figure 7:
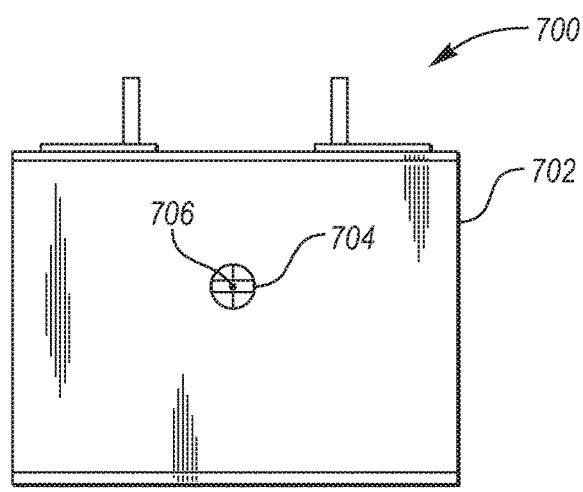
FIG. 7 is an illustration of a SAW sensor mounted to a battery.

FIG. 7 is an illustration of a traction battery 700 including a SAW sensor 706 located at a bulge point 704 of a battery case 702. Placement of the SAW sensor is selected such that inflection of the battery based on expansion/contraction of the battery may be monitored. For example, a SAW sensor may be located to the side of the cell at a location of a maximum bulge point, such as a center of the cell 704. Characterization of the battery may include a simulation of battery operation as well as tests with the SAW sensor as a location and orientation of the sensor for a given application.

In an alternative embodiment, multiple SAW sensors may be located within a traction battery. For example, a traction battery with multiple prismatic battery cells may have a SAW sensor located between a case wall and a prismatic cell, and other SAW sensors may be located sandwiched between adjacent cells such that the expansion and contraction may be monitored at multiple locations. A system with multiple SAW sensors may be configured such that each SAW sensor has a unique OFC configuration thus allowing a controller to transmit or broadcast a signal that each SAW sensor receives and each sensor will in return transmit an encoded reflected signal indicative of the reflected pulse. Based on the reflected signal and the broadcast signal, the controller may use digital signal processing techniques to determine pressures within the traction battery. In some embodiments, a pressure associated with a cell may be determined and used to bypass the cell or discharge the cell.

Figure 8:
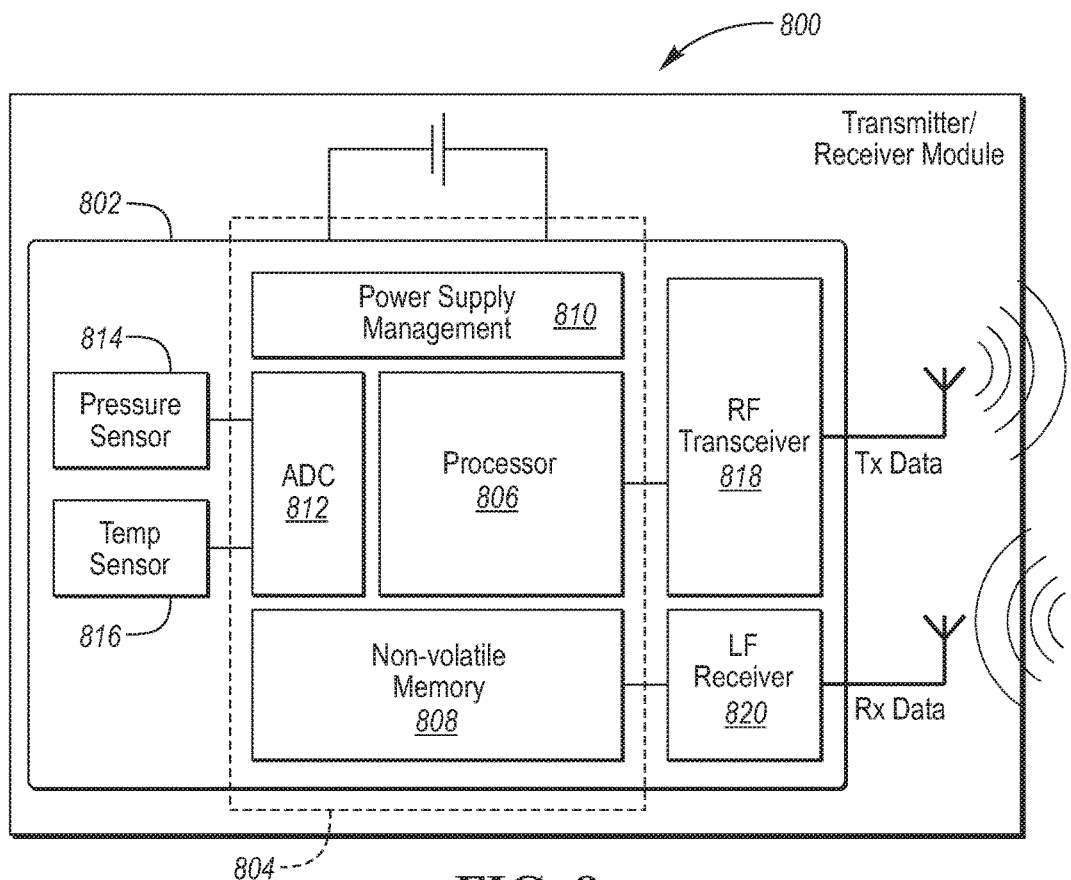
FIG. 8 is a block diagram of a wireless module configured to communicate with a battery SAW sensor.

FIG. 8 is a block diagram of a wireless module 800 for communicating with a battery SAW sensor. The wireless module 800 also referred to as a controller may include a circuit 802 having an embedded microcontroller 804. The microcontroller 804 may include a processor 806 configured to execute instructions from non-volatile memory 808 such as FLASH memory, ROM, or MRAM. The microcontroller 804 may include power supply management circuitry 810, or power supply circuitry may be external to the microcontroller 804. The microcontroller 804 may include an Analog to Digital converter (ADC) 812 to convert external analog signals to the digital representation of those signals. In other embodiments, the ADC may be external to the microcontroller 804. The ADC may be used to convert analog signals such as an analog signal from a pressure sensor 814 or an analog signal from a temperature sensor 816. In other embodiments, sensors may convert the analog reads to digital and communicate digitally using digital interfaces such as Serial Peripheral Interface (SPI), and Peripheral Sensor Interface 5 (PSI5). The pressure sensor 814 and temperature sensor 816 may be configured to measure an ambient pressure and temperature. The wireless module 800 may include a radio frequency (RF) transceiver 818 and a low frequency (LF) receiver 820. The RF transceiver 818 is used to transmit the broadcast signal and receive the reflected signal from one or more SAW sensors. The LF receiver 820 is used to receive LF artifacts of the broadcast signal from the SAW sensor.

Figure 9:
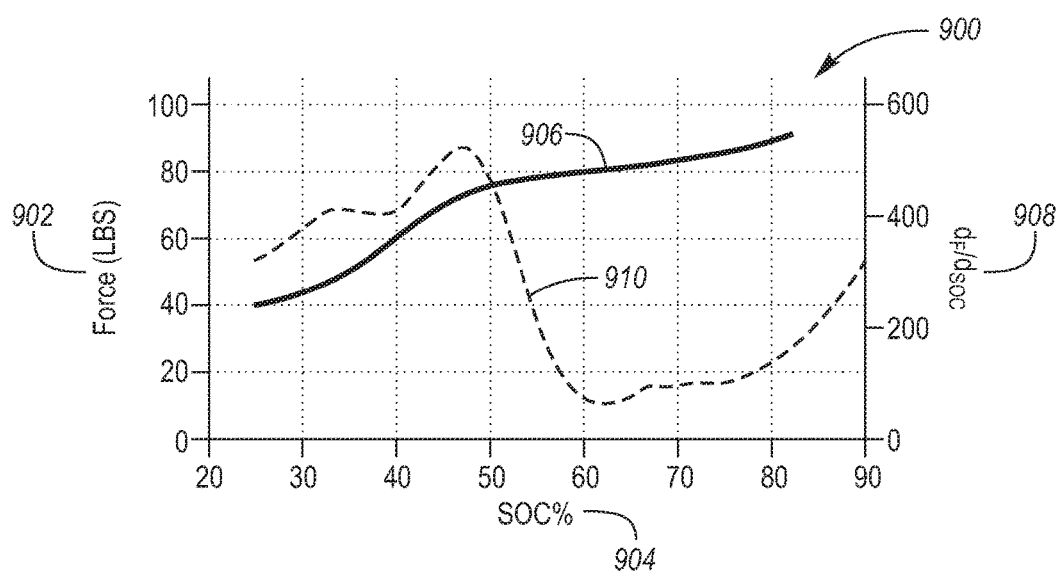
FIG. 9 is a graphical representation of force within a battery with respect to state of charge of the battery.

FIG. 9 is a graphical representation 900 of force 902 within a battery with respect to state of charge (SOC) 904 of the battery. Issues with estimating an SOC of a battery based on an open circuit voltage (OCV) include allowing the battery to rest to accurately measure the OCV and that in a typical range of operation of a traction battery, a change in the OCV is not very large and is therefore subject to accuracy limitation. Here, a battery internal force profile 906 is shown in which a change in internal pressure of the battery as measured by force associated with a change in SOC over a typical range of operation of the traction battery that may result in a greater force change. This greater change of force is able to be measured with greater accuracy than the OCV method thus allowing a more accurate determination of the battery SOC. Further, during operation, the force is able to be measured and an SOC determined unlike a limitation of the OCV method. This allows for an accurate SOC determination during a drive cycle and while the battery is under load. The relationship shown in FIG. 9 is based on Li-ion cells with graphitic anodes, in which the volume expansion of the graphite is typically much larger than that of the cathode. Further, the stress-intercalation state of the negative electrode exhibits a similar shape.

FIG. 9 also illustrates an approximate curve of a rate change of measured force per-volt with respect to change in SOC (dF/dSOC) 908 in relation to the SOC 904. The dF/dSOC profile 910 is associated with a cell temperature of 25 degrees Celsius. One aspect of the use of dF/dSOC is that as the temperature of the cell decreases, the dF/dSOC curve approaches a constant linear profile and that peaks in the curve constantly migrate to an area of lower SOC. This characteristic may be compensated for by a temperature dependent shift and scaling function that changes with respect to temperature.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A battery system comprising:
   a temperature compensated passive wireless surface acoustic wave sensor within a battery configured to receive a broadcast signal and transmit reflected signals; and
   a controller configured to initiate transmission of the broadcast signal, and based on detected differences in phase and amplitude between the broadcast signal and reflected signals from the sensor indicative of an increase in pressure within the battery during charging of the battery, stop the charging.

2. The battery system of claim 1 further comprising a plurality of prismatic battery cells having planar electrodes arranged such that the planar electrodes are generally parallel with a longitudinal axis and lateral axis of the surface acoustic wave sensor.

3. The battery system of claim 2 further including additional temperature compensated passive wireless surface acoustic wave sensors within the battery, wherein a total number of the temperature compensated passive wireless surface acoustic wave sensors is less than a total number of the prismatic battery cells.

4. The battery system of claim 3, wherein the temperature compensated passive wireless surface acoustic wave sensors are tuned to a base frequency, and each of the temperature compensated passive wireless surface acoustic wave sensors includes a reflector that is configured to produce a uniquely encoded reflected pulse from the broadcast signal at the base frequency.

5. The battery system of claim 3, wherein each of the temperature compensated passive wireless surface acoustic wave sensors includes a. reflector that is configured to produce a reflected signal that is orthogonal frequency encoded.

6. The battery system of claim 1, wherein the temperature compensated passive wireless surface acoustic wave sensor includes a 3 $f_0$ interdigitated transducer.

7. The battery system of claim 1, wherein the temperature compensated passive wireless surface acoustic wave sensor includes a plurality of reflectors, and wherein a total number of the reflectors is less than 11.

8. The battery system of claim 1, wherein the temperature compensated passive wireless surface acoustic wave sensor is configured with a base frequency greater than 100 MHz.

9. A method of operating a battery in a vehicle comprising:
   by a controller,
   initiating transmission of a broadcast signal to a surface acoustic wave (SAW) sensor, and
   charging the battery according to a detected difference between the broadcast signal and corresponding reflected signals from the SAW sensor indicative of a pressure within the battery.

10. The method of claim 9, wherein the difference is a difference in phase and amplitude between the broadcast and corresponding reflected signals.

11. The method of claim 10, further comprising terminating the charging responsive to the difference exceeding a threshold.

12. The method of claim 9, wherein the broadcast signal has a base frequency of less than 2 GHz.

13. The method of claim 9 further including decoding, using an orthogonal frequency coding algorithm, the corresponding reflected signals.

14. A vehicle battery system comprising:
   a temperature compensated passive wireless surface acoustic wave sensor within a battery configured to receive a broadcast signal and transmit a reflected signal; and
   a controller configured to initiate transmission of the broadcast signal, and responsive to a detected difference in phase and amplitude between the broadcast signal and a reflected signal from the sensor indicative of a pressure within the battery exceeding a threshold, charge the battery.

15. The vehicle battery system of claim 14 further comprising a plurality of prismatic battery cells having planar electrodes arranged such that the planar electrodes are generally parallel with a longitudinal axis and lateral axis of the surface acoustic wave sensor.

16. The vehicle battery system of claim 15 further including additional temperature compensated passive wireless surface acoustic wave sensors within the battery, wherein a total number of the temperature compensated passive wireless surface acoustic wave sensors is less than a total number of the prismatic battery cells.

17. The vehicle battery system of claim 16, wherein each of the temperature compensated passive wireless surface acoustic wave sensors includes a reflector that is configured to produce a reflected signal that is orthogonal frequency encoded.

18. The vehicle battery system of claim 14, wherein the temperature compensated passive wireless surface acoustic wave sensor includes a $3f_0$ interdigitated transducer.

19. The vehicle battery system of claim 18, wherein the $3f_0$ interdigitated transducer is constructed of aluminum or an aluminum alloy.

20. The vehicle battery system of claim 14, wherein the temperature compensated passive wireless surface acoustic wave sensor includes a Y-cut, z-propagating $LiNbO_3$ substrate.

\* \* \* \* \*